(12) United States Patent
Basceri et al.

(10) Patent No.: US 7,078,757 B2
(45) Date of Patent: Jul. 18, 2006

(54) CAPACITOR CONSTRUCTIONS, SEMICONDUCTOR CONSTRUCTIONS, AND METHODS OF FORMING ELECTRICAL CONTACTS AND SEMICONDUCTOR CONSTRUCTIONS

(75) Inventors: Cem Basceri, Boise, ID (US); Garo J. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/917,705

(22) Filed: Aug. 13, 2004

(65) Prior Publication Data
US 2005/0017359 A1    Jan. 27, 2005

Related U.S. Application Data

(62) Division of application No. 10/389,659, filed on Mar. 13, 2003, which is a division of application No. 10/094,581, filed on Mar. 6, 2002, now Pat. No. 6,900,106.

(51) Int. Cl.
*H01L 27/108* (2006.01)

(52) U.S. Cl. .................. 257/296; 257/301; 257/306; 257/534

(58) Field of Classification Search .......... 438/244, 438/253–256, 387, 391, 396–399; 257/296
See application file for complete search history.

(56) References Cited

U.S. PATENT DOCUMENTS

| | | |
|---|---|---|
| 5,371,701 A | 12/1994 | Lee et al. |
| 5,565,708 A | 10/1996 | Ohsaki et al. |
| 5,837,591 A | 11/1998 | Shimada et al. |
| 5,950,092 A | 9/1999 | Figura et al. |
| 6,001,420 A * | 12/1999 | Mosely et al. .............. 427/258 |
| 6,004,857 A | 12/1999 | Hsiao et al. ................ 438/396 |
| 6,017,144 A | 1/2000 | Guo et al. |
| 6,025,652 A | 2/2000 | Tsukamoto |
| 6,093,615 A | 7/2000 | Schuele et al. ............ 438/396 |
| 6,096,595 A * | 8/2000 | Huang ........................ 438/238 |
| 6,174,781 B1 | 1/2001 | Dai et al. |
| 6,248,640 B1 | 6/2001 | Nam |
| 6,287,935 B1 | 9/2001 | Coursey |
| 6,300,216 B1 | 10/2001 | Shan |
| 6,319,771 B1 | 11/2001 | Tseng |
| 6,323,558 B1 | 11/2001 | Jeong |
| 6,380,579 B1 | 4/2002 | Nam et al. |

(Continued)

OTHER PUBLICATIONS

Wolf et al., "Silicon Processing for the VLSI Era vol. 1: Process Technology", Lattice Press, 1986, pp. 160-175.

*Primary Examiner*—Kenneth Parker
*Assistant Examiner*—José R. Diaz
(74) *Attorney, Agent, or Firm*—Wells St. John, P.S.

(57) ABSTRACT

The invention includes a method of forming a semiconductor construction. A semiconductor substrate is provided, and a conductive node is formed to be supported by the semiconductor substrate. A first conductive material is formed over the conductive node and shaped as a container. The container has an opening extending therein and an upper surface proximate the opening. The container opening is at least partially filled with an insulative material. A second conductive material is formed over the at least partially filled container opening and physically against the upper surface of the container. The invention also includes semiconductor structures.

21 Claims, 6 Drawing Sheets

U.S. PATENT DOCUMENTS

| | | |
|---|---|---|
| 6,461,911 B1 | 10/2002 | Ahn et al. .................. 438/253 |
| 6,472,229 B1 | 10/2002 | Aoki et al. |
| 6,492,245 B1 | 12/2002 | Liu et al. |
| 6,534,357 B1 | 3/2003 | Basceri et al. |
| 6,645,811 B1 | 11/2003 | Roh |
| 6,720,609 B1 | 4/2004 | Deboer |
| 2001/0039107 A1* | 11/2001 | Suguro ....................... 438/585 |
| 2002/0153552 A1 | 10/2002 | Hieda et al. |
| 2003/0047734 A1 | 3/2003 | Fu et al. |
| 2004/0048467 A1 | 3/2004 | Marsh |

* cited by examiner

CAPACITOR CONSTRUCTIONS, SEMICONDUCTOR CONSTRUCTIONS, AND METHODS OF FORMING ELECTRICAL CONTACTS AND SEMICONDUCTOR CONSTRUCTIONS

CROSS REFERENCE TO RELATED APPLICATION

This patent application is a is a Divisional Application of U.S. patent application Ser. No. 10/389,659, filed Mar. 13, 2003, entitled "Capacitor Constructions, Semiconductor Constructions, and Methods of Forming Electrical Contacts and Semiconductor Constructions," naming Cem Basceri and Garo J. Derderian as inventors, which is a Divisional Application of U.S. patent application Ser. No. 10/094,581, filed Mar. 6, 2002, now U.S. Pat. No. 6,900,106 the disclosures of which are hereby incorporated by reference.

TECHNICAL FIELD

The invention pertains to methods of forming semiconductor constructions, and pertains to the constructions themselves. In particular aspects, the invention pertains to methods of forming electrical contacts and/or methods of forming capacitor constructions.

BACKGROUND OF THE INVENTION

One type of semiconductor construction is a metal-insulator-metal (MIM) capacitor construction. A fragment 10 of a semiconductor structure is illustrated in FIG. 1, and such shows an exemplary MIM capacitor construction 20. More specifically, fragment 10 comprises a substrate 12 having a conductively-doped diffusion region 14 therein. Substrate 12 can comprise, for example, monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Conductively-doped diffusion region 14 can be doped with one or both of n-type and p-type dopant.

A conductive pedestal 16 is supported by substrate 12, and formed in electrical connection with diffusion region 14. Pedestal 16 can comprise metal and/or conductively doped silicon. In particular aspects, pedestal 16 will comprise, consist essentially of, or consist of conductively-doped silicon such as, for example, conductively-doped polycrystalline silicon.

An insulative mass 18 is formed over substrate 12 and around pedestal 16. Alternatively, pedestal 16 can be considered to extend through mass 18 and to the diffusion region 14 formed within substrate 12. Mass 18 can comprise, for example, borophosphosilicate glass (BPSG).

A first capacitor electrode 22 and barrier 24 extend within an opening in insulative material 18 to electrically contact pedestal 16. First capacitor electrode 22 will comprise a metal in a MIM construction, and can comprise, for example, one or more of platinum, rhodium, ruthenium, titanium, tantalum and tungsten. Barrier layer 24 can comprise, for example, titanium nitride, tantalum nitride, and/or tantalum silicon nitride.

An insulative material 26 is formed over capacitor electrode 22. Material 26 can comprise, for example, one or more of aluminum oxide ($Al_2O_3$), tantalum pentoxide, barium strontium titanate (BST), lead zirconate titanate (PZT), and/or lead lanthanum zirconate titanate (PLZT).

Barrier layer 24 is provided to alleviate and/or prevent cross-diffusion of materials from dielectric 26 and conductive pedestal 16. Specifically, silicon from a silicon-containing pedestal 16 can migrate through conductive material 22, and oxygen from a dielectric material 26 can also migrate through conductive material 22.

The migration of materials through conductive material 22 is thought to occur along grain boundaries. Specifically, material 22 will generally be formed as a layer, as shown, and will comprise columnar grains extending through the thickness of the layer and defining boundaries 23 between the grains. The boundaries 23 can, as shown, extend across an entirety of the thickness of material 22. Oxygen and silicon are believed to be able to migrate along boundaries 23, and thereby pass through conductive material 22. Barrier layer 24 is provided to block such migration through material 22.

A final component of structure 10 is a second capacitor electrode 28 which is provided over dielectric material 26. Electrode 28 can comprise any of various conductive materials, including, for example, the same conductive materials described above for incorporation into the first capacitor electrode 22.

Capacitor electrode 28 is capacitively separated from first electrode 22 by dielectric material 26. Accordingly, first electrode 22, dielectric material 26 and second electrode 28 together define at least a portion of a capacitor construction.

It would be desirable to develop new methods for alleviating or preventing diffusion through metal layers (such as, for example, the capacitor electrode 22 metal layer of FIG. 1), and to incorporate such methods into formation of electrical contacts and/or capacitor constructions.

SUMMARY OF THE INVENTION

In one aspect, the invention encompasses a method of forming an electrical contact. A semiconductor substrate is provided, and a conductive node is formed to be supported by the semiconductor substrate. A first conductive material is formed over the conductive node and shaped as a container. The container has an opening extending therein and an upper surface proximate the opening. The container opening is at least partially filled with an insulative material. A second conductive material is formed over the at least partially filled container opening and physically against the upper surface of the container.

In one aspect, the invention encompasses a capacitor construction. The construction includes a semiconductor substrate comprising a silicon-containing surface. A first conductive material is over the silicon-containing surface and shaped as an upwardly-opening container. The container has an upper surface proximate the opening. A first insulative material is within the container opening. A second conductor material is over the container opening and physically against the upper surface of the container. A second insulative material is over the second conductor material. A third conductive material is over the second insulative material. The third conductive material is capacitively separated from the second conductive material by the second insulative material.

In one aspect, the invention encompasses a semiconductor construction. The construction includes a semiconductor substrate, and a silicon-containing electrically conductive node supported by the semiconductor substrate. A first conductive layer is physically against a surface of the conductive node and shaped as a container. The first conductive layer has a first thickness and has grain boundaries extending across the first thickness. A second conductive layer is over the container and physically against the upper surface of the container. The second conductive layer comprises a second thickness and has grain boundaries extending across the second thickness.

BRIEF DESCRIPTION OF THE DRAWINGS

Preferred embodiments of the invention are described below with reference to the following accompanying drawings.

FIG. 9 is a view of the FIG. 2 fragment shown at a processing stage subsequent to that of. FIG. 3 in accordance with a second aspect of the invention.

DETAILED DESCRIPTION OF THE PREFERRED EMBODIMENTS

An exemplary aspect of the invention is described with reference to FIGS. 2–8. In referring to FIGS. 2–8, similar numbering will be used as was utilized above in describing the prior art, where appropriate.

Figure 1:
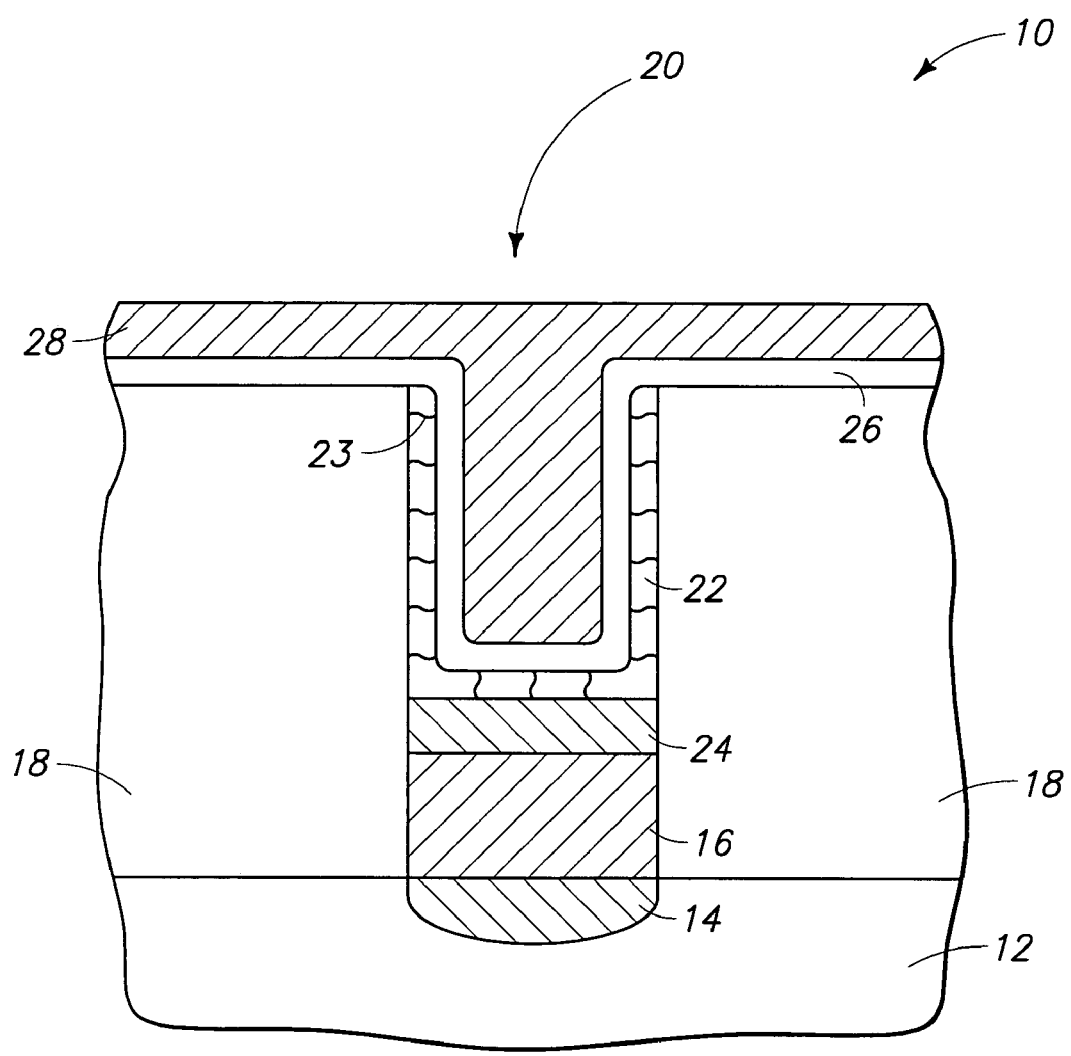
FIG. 1 is a diagrammatic, cross-sectional view of a fragment of a prior art semiconductor construction, illustrating a metal-insulator-metal capacitor construction.
Figure 2:
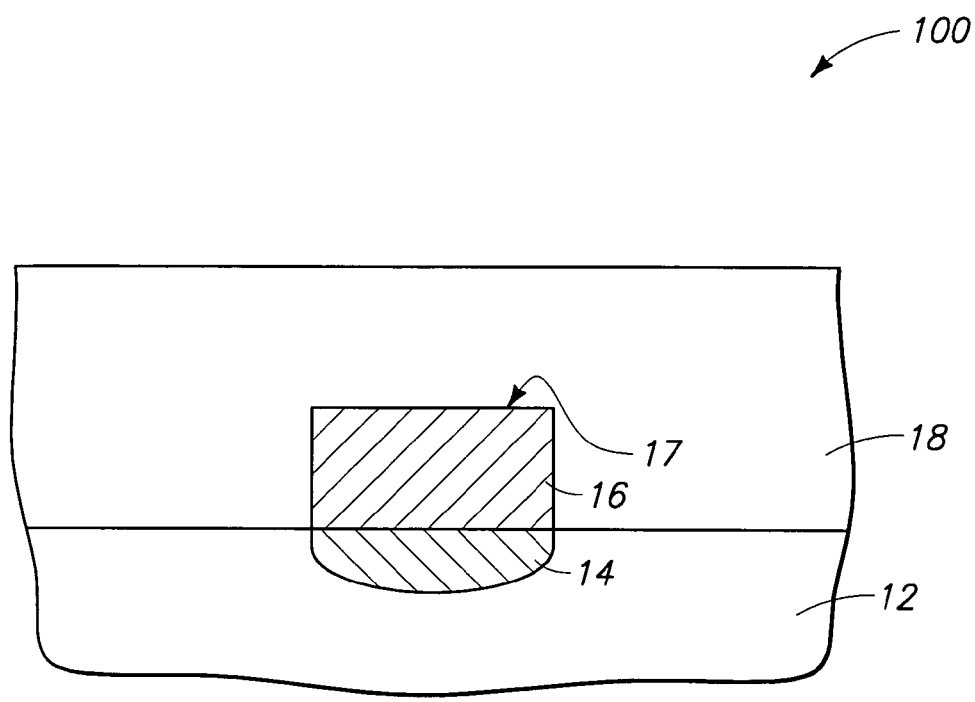
FIG. 2 is a diagrammatic, fragmentary, cross-sectional view of a semiconductor construction illustrating a preliminary stage of a method of a particular aspect of the present invention.

Referring initially to FIG. 2, a fragment of a semiconductor construction 100 is illustrated. The fragment comprises a semiconductor substrate 12 which can comprise, consist essentially of, or consist of silicon, and in particular cases can comprise monocrystalline silicon lightly-doped with an appropriate background dopant.

A conductively-doped diffusion region 14 is within semiconductive material substrate 12, and a conductive pedestal 16 is formed over and in electrical contact with diffusion region 14. Diffusion region 14 can, in particular applications, be a source/drain region associated with a transistor construction, and in such applications there would be a transistor gate (not shown) proximate diffusion region 14. In applications in which diffusion region 14 is a source/drain region of a transistor construction, it can be fabricated as part of a memory cell array, such as, for example, a dynamic random access memory (DRAM) cell array.

A pedestal 16 is formed over and in electrical contact with diffusion region 14. Pedestal 16 can comprise, for example, metal, metal compounds, and/or conductively-doped silicon. In particular applications, pedestal 16 will comprise, consist essentially of, or consist of conductively-doped silicon, such as, for example, conductively-doped polycrystalline silicon. In applications in which pedestal 16 comprises conductively-doped silicon, the dopant can be one or both of n-type dopant and p-type dopant. Pedestal 16 can be in physical contact against conductively-doped diffusion region 14, as shown, or alternatively can be separated from diffusion region 14 by various intervening layers, which can include, for example, a metal silicide layer (not shown). Pedestal 16 can be referred to as a conductive node supported by semiconductor substrate 12.

Pedestal 16 comprises an upper surface 17.

An insulative mass 18 is formed over semiconductor substrate 12 and pedestal 16. Mass 18 can comprise, for example, BPSG.

Figure 3:
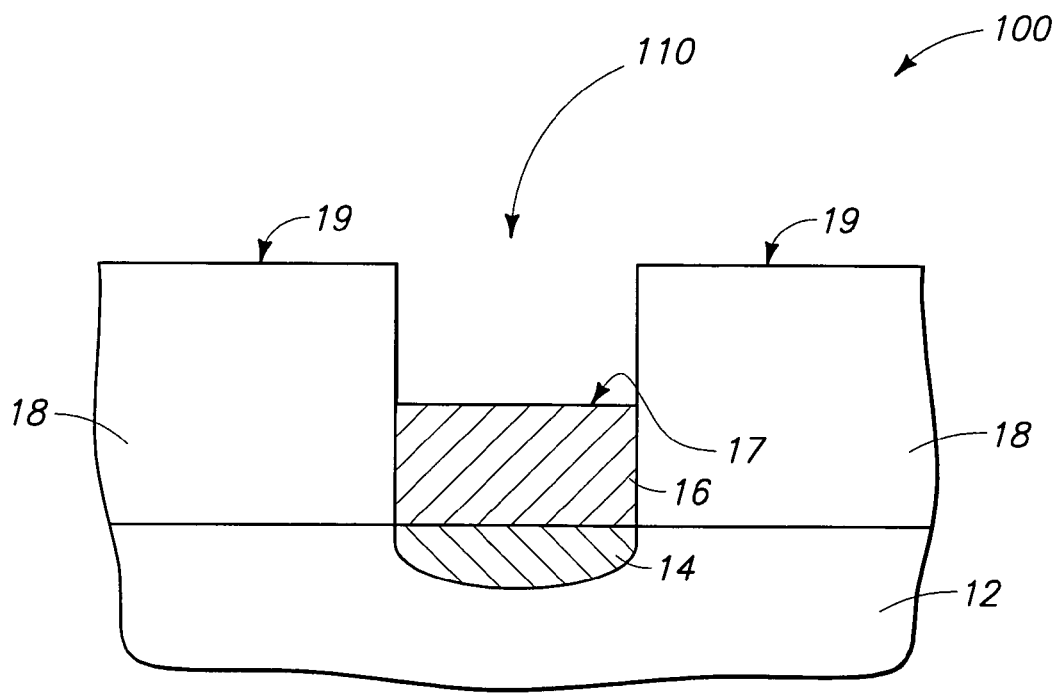
FIG. 3 is a view of the FIG. 2 fragment shown at a processing stage subsequent to that of FIG. 2.

Referring to FIG. 3, an opening 110 is formed into mass 18, and extends to upper surface 17 of node 16. Mass 18 comprises an upper surface 19 proximate opening 110, and in the shown aspect of the invention, surface 19 is an uppermost surface of insulative mass 18.

Figure 4:
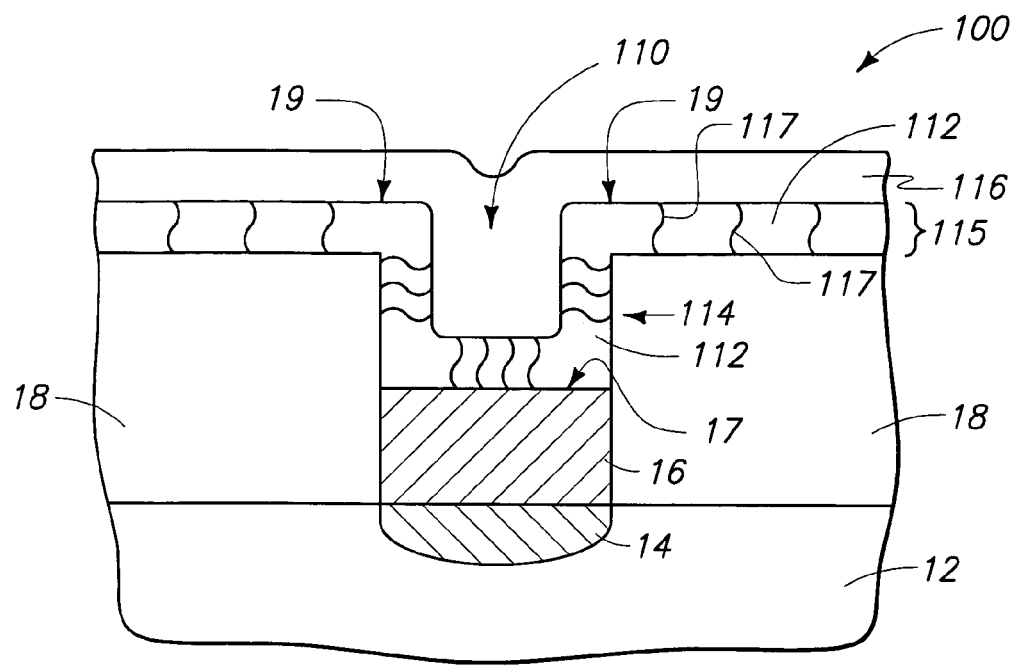
FIG. 4 is a view of the FIG. 2 fragment shown at a processing stage subsequent to that of FIG. 3.

Referring to FIG. 4, a conductive material 112 is formed over mass 18 and within opening 110 to partially fill the opening. Conductive material 112 narrows opening 110 and forms a container-shape 114 within the opening. The container-shape opens upwardly within the opening 110, and a material 116 is formed over conductive material 112 and within the upwardly-opening container shape 114.

Conductive material 112 can be referred to as a first conductive material to distinguish the material from other conductive materials which can be subsequently formed over conductive material 112 in various aspects of the invention (some of which are described below). Conductive material 112 can comprise, consist of, or consist essentially of one or more of platinum, rhodium, ruthenium, iridium, titanium, tantalum and tungsten; and in particular aspects can comprise, consist of, or consist essentially of one or more of rhodium oxide, ruthenium oxide, iridium oxide, titanium nitride, titanium boronitride, tantalum nitride, tantalum boronitride, platinum/rhodium, titanium aluminum nitride, and tungsten nitride.

Conductive material 112 has a thickness 115, and has columnar grains therein, with grain boundaries 117 extending across the thickness 115 (only some of the grain boundaries 117 are labeled).

Conductive material 112 is shown being formed physically against upper surface 17 of pedestal 16. Accordingly, in embodiments in which pedestal 16 comprises silicon, first conductive material 112 can be formed physically against the silicon.

First conductive material 112 can be formed by, for example, either physical vapor deposition or chemical vapor deposition. It can be preferred to form conductive material 112 by physical vapor deposition, in order to obtain conformal coverage within opening 110.

The material 116 formed over conductive material 112 can be an insulative material, and preferably is a material which can be a good barrier to silicon diffusion and/or oxygen diffusion. Suitable materials can be selected from the group consisting of silicon nitride, silicon oxynitride, silicon carbide, silicon dioxide, and mixtures thereof.

First conductive material 112 can have a thickness of, for example, from about 100 angstroms to about 300 angstroms, and material 116 can be formed to a thickness of, for example from about 300 angstroms to about 10,000 angstroms. Material 116 can be formed by, for example, chemical vapor deposition.

Figure 5:
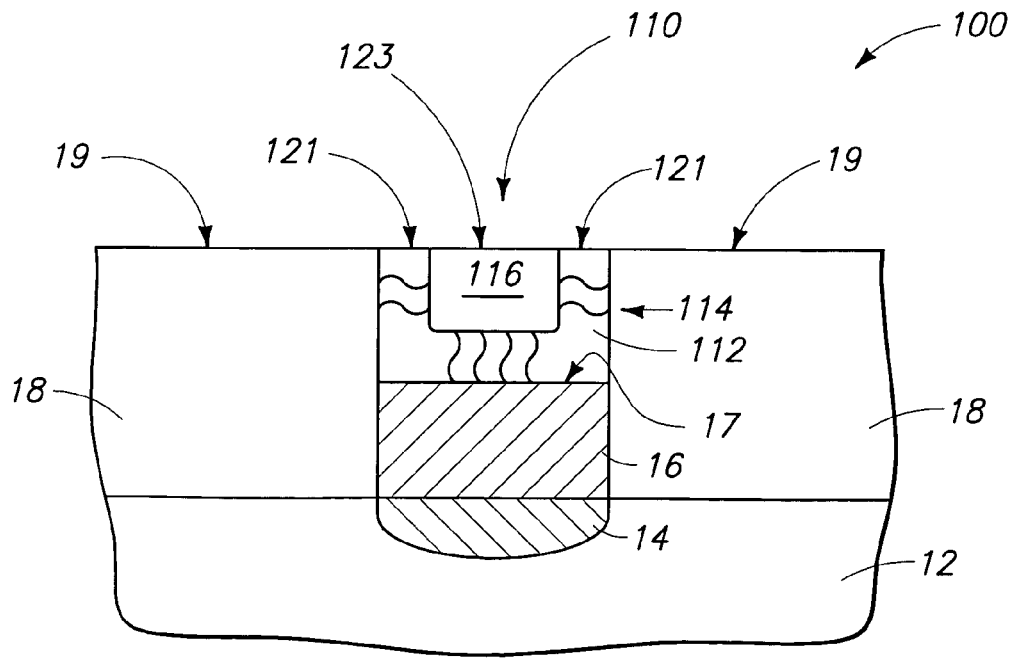
FIG. 5 is a view of the FIG. 2 fragment shown at a processing stage subsequent to that of FIG. 4.

Referring to FIG. 5, construction 100 is illustrated after being exposed to a polishing condition which removes conductive material 112 from over upper surface 19 of mass 18, while leaving material 112 within the opening 110 extending into mass 18. It is noted that some of mass 18 can be removed during the polishing operation, and accordingly the upper surface 19 of FIG. 5 can be at a lower elevational level than is the upper surface 19 of FIG. 4. In the shown aspect of the invention, materials 112 and 116 are both provided over mass 18 prior to the polishing operation, and accordingly the polishing removes both materials 112 and 116 from over mass 18. Suitable polishing can comprise, for example, chemical-mechanical polishing. It is noted that conductive material 112 can be removed from over surface 19 utilizing an etchback (such as, for example, a dry etchback) in addition to, or alternatively to, the polishing.

After the polishing, conductive material 112 defines an upwardly-opening container over conductive node 16, and such container comprises uppermost surfaces 121 proximate the upwardly-facing opening within the container. Material 116 at least partially fills the container opening, and in the shown embodiment entirely fills the container opening. Material 116 has an upper surface 123.

In the shown aspect of the invention, the polishing has created a planarized upper surface of mass 18, material 112, and material 116; with such planarized upper surface including surfaces 19, 121 and 123.

Figure 6:
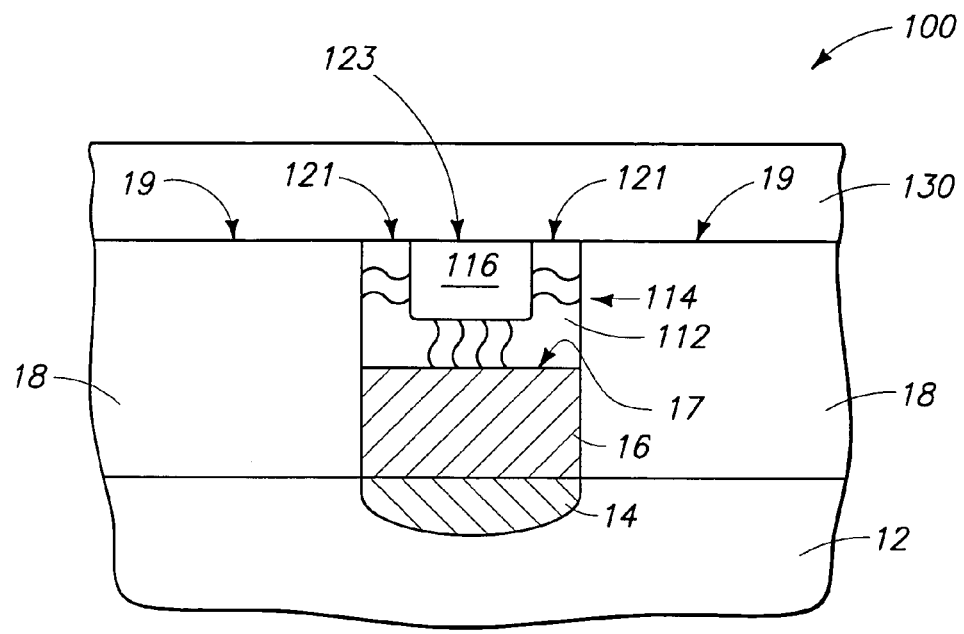
FIG. 6 is a view of the FIG. 2 fragment shown at a processing stage subsequent to that FIG. 5.

Referring to FIG. 6, an insulative mass 130 is formed across surfaces 19, 121 and 123. Mass 130 can comprise, for example, borophosphosilicate glass.

Figure 7:
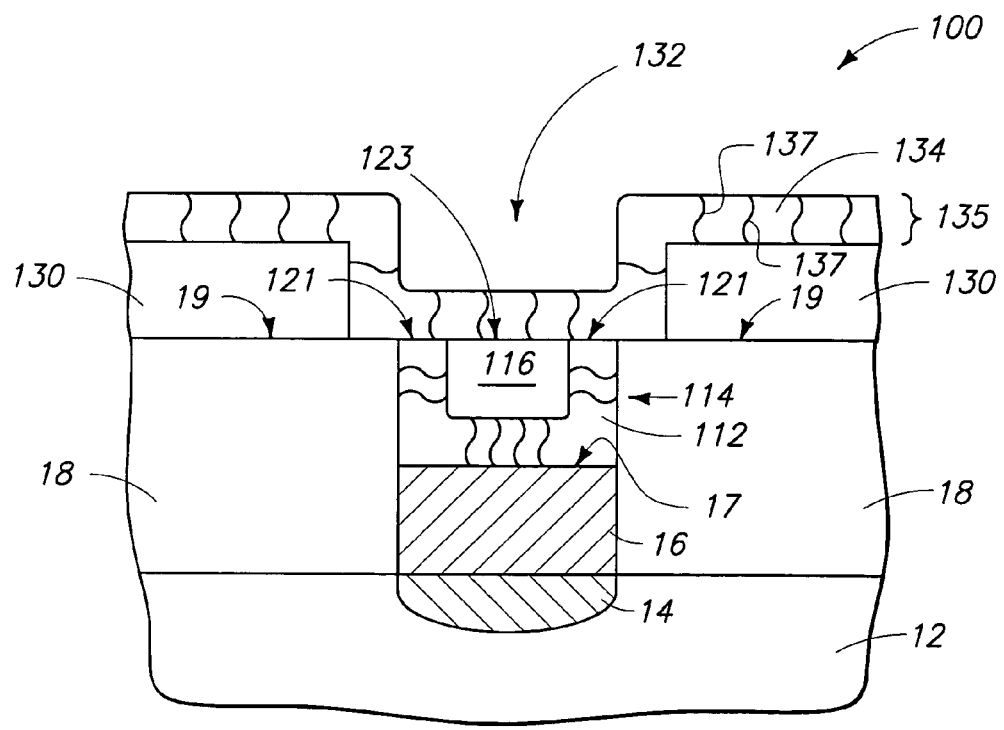
FIG. 7 is a view of the FIG. 2 fragment shown at a processing stage subsequent to that of FIG. 6.

Referring to FIG. 7, an opening 132 is formed through mass 130 and to upper surfaces 121 of first conductive material 112. A second conductive material 134 is formed within opening 132, and in the shown aspect of the invention, in physical contact with upper surfaces 121 of first conductive material 112. Second conductive material 134 is also formed in physical contact with uppermost surface 123 of material 116 in the shown aspect of the invention. Material 134 is shown as a layer having a thickness 135, and such thickness can be, for example, from about 100 angstroms to about 300 angstroms. Further, material 134 is shown having columnar grains and grain boundaries 137 extending therethrough (with only some of the grain boundaries 137 being labeled).

Material 134 can comprise the same materials described above relative to material 112. Accordingly, material 134 can comprise one or more of platinum, iridium, rhodium, ruthenium, titanium, tantalum and tungsten. In particular applications, material 134 can comprise, consist essentially of, or consist of one or more of rhodium oxide, ruthenium oxide, iridium oxide, titanium nitride, titanium boronitride, tantalum nitride, tantalum boronitride, platinum/rhodium, titanium aluminum nitride, and tungsten nitride.

Material 134 can be formed by, for example, physical vapor deposition, chemical vapor deposition or atomic layer deposition. In particular aspects, it can be advantageous to form material 134 by chemical vapor deposition, as such can be more economical than physical vapor deposition. It is noted that such is opposite to the discussion above regarding formation of material 112, wherein it was indicated that it can be advantageous to form material 112 by physical vapor deposition. The difference in preferred aspects for formation of materials 112 and 134 is due to a difference in critical dimensions of the opening 110 (FIG. 3) that material 112 is formed in relative to the opening 132 that material 134 is formed in. The higher critical dimension of opening 110 can render physical vapor deposition advantageous relative to chemical vapor deposition, and the smaller critical dimension of opening 132 can render chemical vapor deposition more advantageous than physical vapor deposition. Accordingly, in particular aspects of the invention, materials 112 and 134 can be substantially identical in composition (with the term "substantially identical" indicating that there may be differences in minor constituents or contaminants of the materials), but can be formed by different deposition processes; with material 112 being formed by physical vapor deposition and material 134 being formed by chemical vapor deposition.

The formation of material 134 narrows opening 132, and forms an upwardly-opening container shape of material 134 within opening 132.

Figure 8:
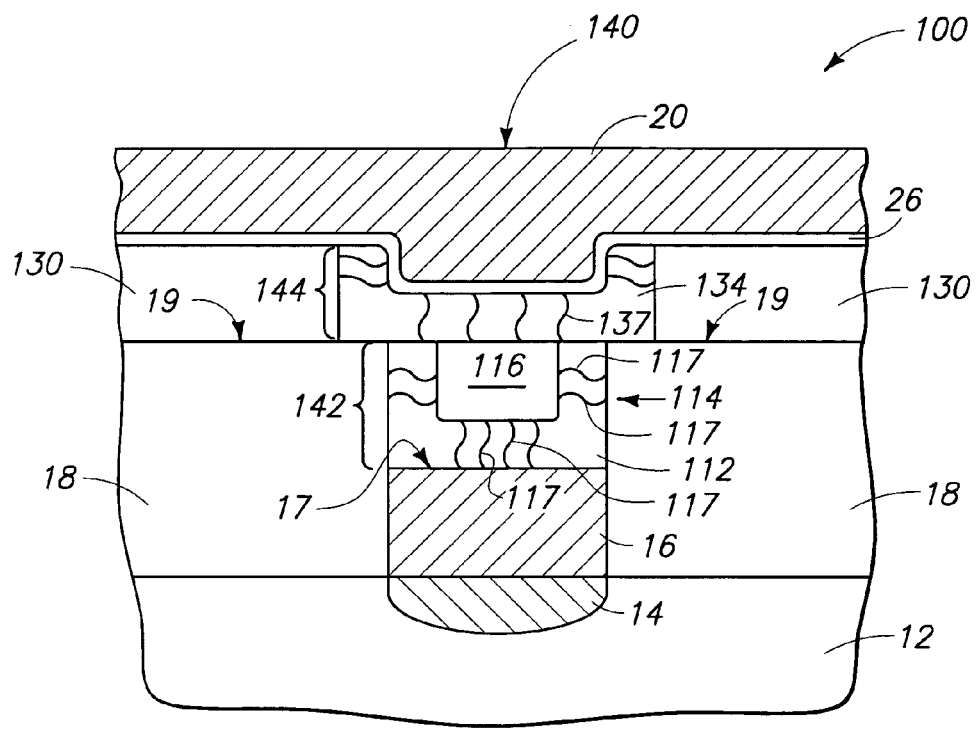
FIG. 8 is a view of the FIG. 2 fragment shown at a processing stage subsequent to that of FIG. 7.

Referring to FIG. 8, material 134 is removed from an upper surface of mass 130 by suitable processing, such as, for example, chemical-mechanical processing. Subsequently, an insulative material 26 and a conductive material 20 are formed over material 134. Insulative material 26 can comprise, for example, a material selected from the group consisting of tantalum oxide, aluminum oxide ($Al_2O_3$), zirconium oxide, hafnium oxide, hafnium-aluminum oxide, SBT, BST, PZT, PLZT, and mixtures thereof. Conductive material 20 can comprise, for example, the materials described above form material 134. Accordingly, material 20 can comprise, for example, one or more of platinum, rhodium, iridium, ruthenium, titanium, tantalum and tungsten. Material 134 can additionally, or alternatively, comprise conductively-doped semiconductive material, such as, for example, conductively-doped silicon. In particular aspects, material 116 can be referred to as a first insulative material, and material 26 can be referred to as a second insulative material. Also, in particular aspects, conductive materials 112, 134 and 20 can be referred to as first, second and third conductive materials, respectively. The second conductive material 134 can be considered to be capacitively separated from third conductive material 20 by insulative material 26. Accordingly, materials 134, 26 and 20 can be considered to together define a capacitor construction 140.

Materials 112 and 116 can be together considered a barrier between conductive material 134 and a silicon-comprising surface 17 of pedestal 16. Specifically, to the extent that oxygen diffusion from insulative material 26 penetrates downwardly along grain boundaries 137, the oxygen is prevented from further migration by materials 116 and 112. Material 116 is preferably chosen to be a good barrier to oxygen diffusion, and material 112 is ultimately a good barrier due to the grain boundaries 117 being oriented in the wrong direction to permit channeling of oxygen through material 112 and to silicon-comprising surface 17. Further, materials 116 and 112 can prevent silicon migration from pedestal 16 to insulative material 26. Specifically, material 116 is preferably chosen to be a good barrier to silicon migration, so that any silicon migrating from mass 16, through material 112 and to material 116 is blocked from further migration. Further, grain boundaries 117 are oriented in the wrong direction along sidewalls of container 114 to prevent silicon migration directly through sidewalls of the container defined by material 112.

Material 112 can be considered a conductive electrical contact between the node defined by pedestal 16 and the capacitor electrode defined by material 134, in particular aspects of the invention.

The particular thickness 142 of the barrier defined by layers 112 and 116 can vary, with an exemplary suitable thickness being from about 300 angstroms to about 10,000 angstroms. Further, the relative thickness 144 of a container defined by material 134 to the thickness 142 can vary, and the shown diagrammatic illustration should not be understood to imply a particular constraint on the relationship of the thicknesses.

Although the aspect of the invention described with reference to FIGS. 2–8 utilizes an electrical node 16 in the form of a pedestal formed over a diffusion region 14, it is to be understood that other electrical nodes can be utilized in various aspects of the invention. For instance, pedestal 16 can be eliminated, and layer 112 formed directly on the conductively-doped diffusion region 14.

The aspect described with reference to FIGS. 2–8 is but one suitable method for forming a barrier comprising materials 112 and 116. Another method is described with reference to FIGS. 9 and 10. In referring to FIGS. 9 and 10, similar numbering will be utilized as was used above in describing FIGS. 2–8, where appropriate.

Figure 9:
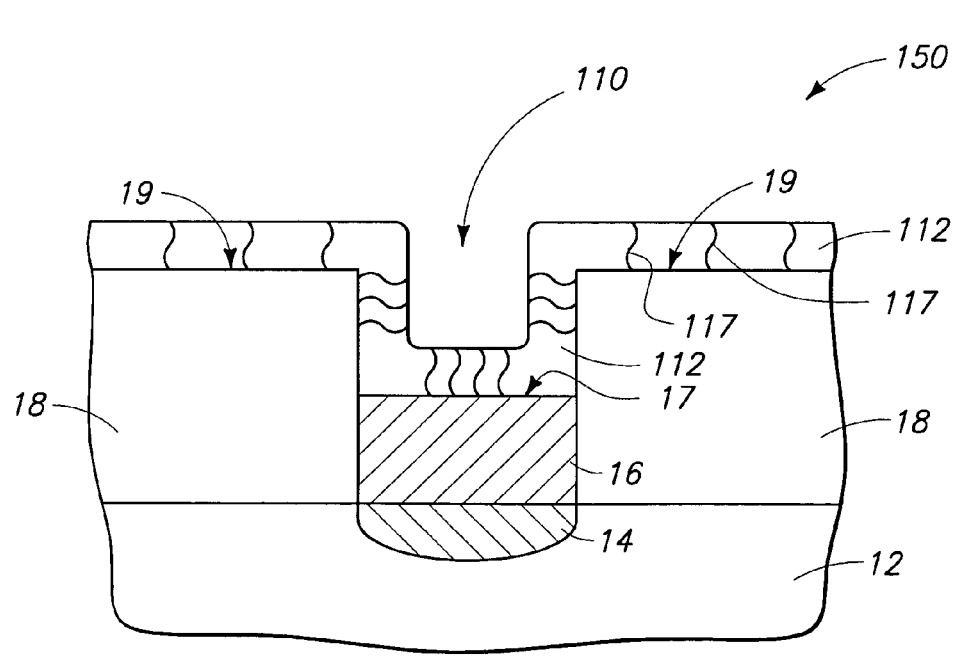

Referring initially to FIG. 9, a fragment of a semiconductor construction 150 is illustrated. The fragment comprises a semiconductor substrate 12, a conductively-doped diffusion region 14, a pedestal 16, and an insulative mass 18, as described above with reference to the construction 100 of FIGS. 2–8. Insulative mass 18 has an opening 110 extending therein. The construction 150 of FIG. 9 can comprise a processing stage subsequent to that described with reference to FIG. 3.

Conductive material 112 is formed across an upper surface 19 of insulative mass 18, and within opening 110. Conductive material 112 can be formed utilizing the processing conditions described above with reference to FIG. 4. A difference between the processing stage of FIG. 9 and that of FIG. 4 is that material 116 (FIG. 4) is not formed at the processing stage of FIG. 9.

Figure 10:
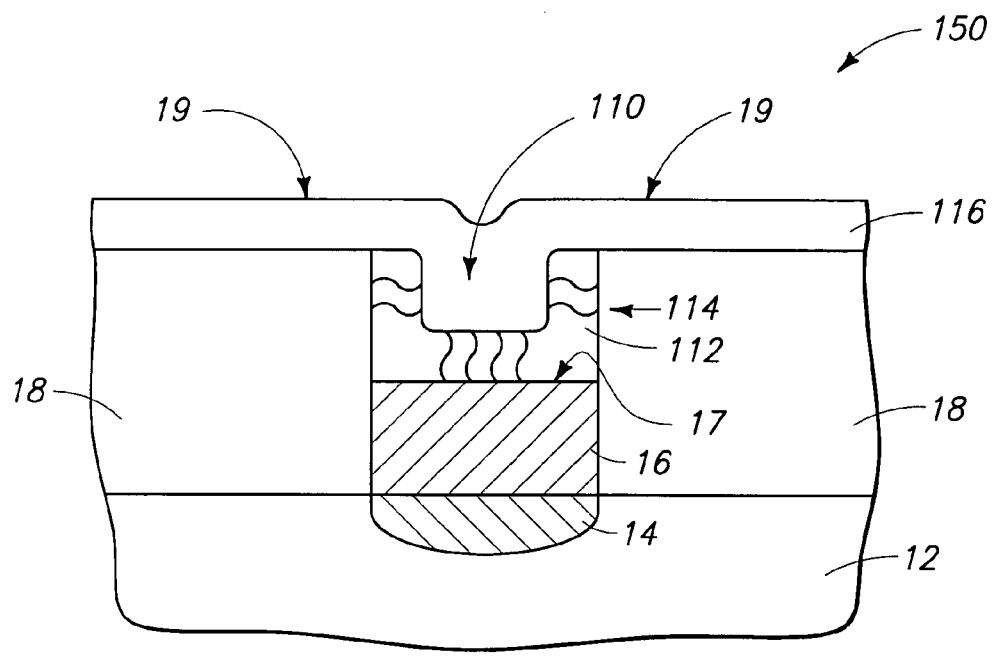
FIG. 10 is a view of the FIG. 2 fragment shown at a processing step subsequent to that of FIG. 9.

Referring to FIG. 10, construction 150 is subjected to polishing which removes material 112 from over mass 18 and leaves the material within opening 110. The material 112 within opening 110 defines an upwardly-opening container shape 114. The removal of material 112 from over upper surface 19 of mass 18 can comprise, for example, chemical-mechanical polishing. After such polishing, material 116 is formed over mass 18, and within the container shape 114. Material 116 can then be removed from over mass 18 by suitable processing, such as, for example, chemical-mechanical polishing to form a structure identical to that illustrated in FIG. 5. The processing of FIGS. 6–8 can follow, to ultimately form the construction illustrated in FIG. 8. A difference between the methodology of FIGS. 9 and 10, and that described above with reference to FIGS. 2–8, is that material 116 is formed after polishing of material 112 in the processing sequence of FIGS. 9 and 10.

Figure 11:
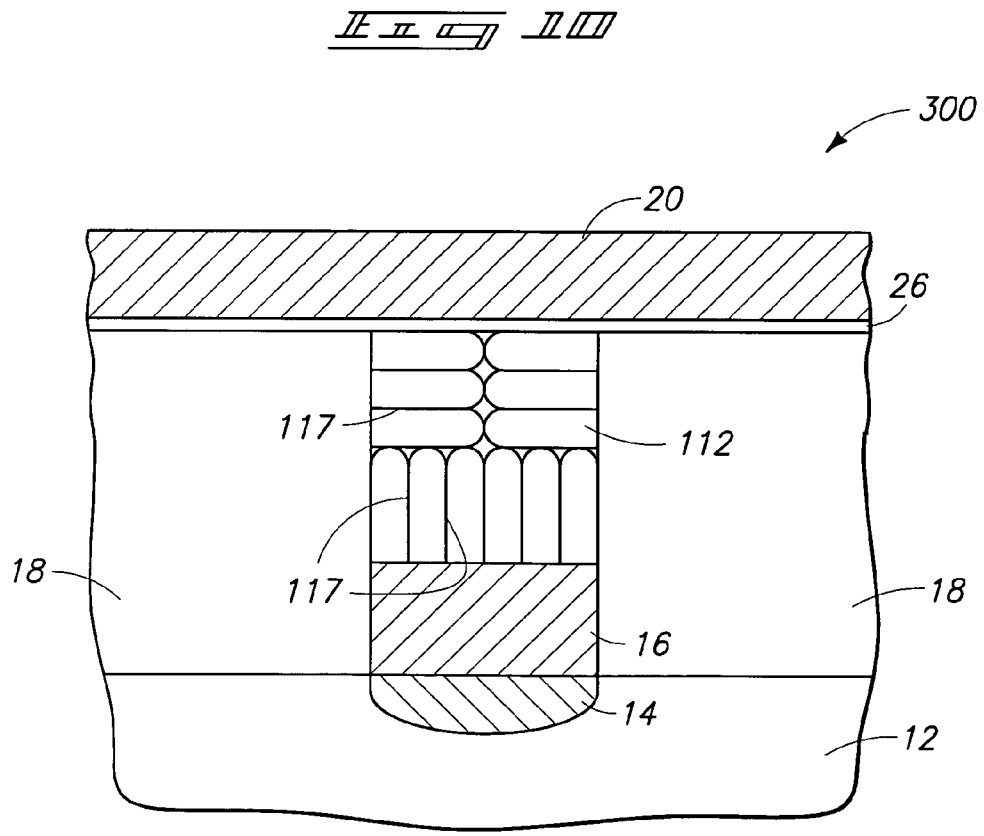
FIG. 11 is a view of the FIG. 2 fragment shown at a processing stage subsequent to that of FIG. 3 in accordance with a third aspect of the invention.

Another method of forming a barrier is described with reference to a construction 300 in FIG. 11. In referring to FIG. 11, similar numbering will be utilized as was used above in describing FIGS. 2–10, where appropriate. The construction of FIG. 11 can be considered to correspond to a processing stage subsequent to that of FIG. 3.

Construction 300 comprises a semiconductor substrate 12, a conductively-doped diffusion region 14, a pedestal 16, and an insulative mass 18, as described above with reference to the construction 100 of FIGS. 2–8.

A conductive material 112 is formed over pedestal 16. Conductive material 112 comprises columnar grains separated by boundaries 117. The columnar grains are illustrated as discrete grains in FIG. 11, relative to the more diagrammatic illustrations of FIGS. 4–10, to illustrate particular attributes of the grain structures of FIG. 11. Specifically, the grains extend inwardly from substrates adjacent opening 110 (FIG. 3), and accordingly lower grains extend upwardly from a bottom of the opening while upper grains extend laterally from sidewalls of the opening. The grain structures of FIG. 11 can be formed utilizing atomic layer deposition of material 112.

After formation of material 112, materials 26 and 20 are formed over the material 112. The laterally extending grain boundaries of the upper portion of material 112 can alleviate, and even prevent, cross-diffusion of species between pedestal 16 and insulative material 26.

Construction 300 can be considered to comprise a conductive node 16 supported by semiconductor substrate 12, and a first conductive material 112 over the conductive node. The first conductive material comprises a lower portion with vertically-extending grains and an upper portion with horizontally extending grains. Construction 300 also comprises a dielectric material 26 over the upper portion of the first conductive material. The dielectric material is separated from the lower portion of the first conductive material by the upper portion of the first conductive material. Construction 300 additionally comprises a second conductive material 20 over the dielectric material. The second conductive material is capacitively separated from the first conductive material by the dielectric material.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor construction, comprising:
   a semiconductor substrate;
   a conductive node supported by the semiconductor substrate;
   a first conductive material physically against a surface of the conductive node and shaped as a first upwardly-opening container having a first container opening therein, the first container having an upper surface proximate the first container opening;
   an insulative material within the first container opening; and
   a second conductive material over the first container opening and physically against the upper surface of the first container, the second conductive material being shaped as a second upwardly-opening container having a second container opening therein.

2. The construction of claim 1 wherein the insulative material entirely fills the first container opening.

3. The construction of claim 1 wherein the first conductive material is substantially the same as the second conductive material.

4. The construction of claim 1 wherein the first conductive material comprises one or more of platinum, rhodium, iridium, ruthenium, titanium, tantalum, and tungsten.

5. The construction of claim 1 wherein the first conductive material comprises one or more of rhodium oxide, ruthenium oxide, iridium oxide, titanium nitride, titanium boronitride, tantalum nitride, tantalum boronitride, titanium aluminum nitride, and tungsten nitride.

6. The construction of claim 1 wherein the second conductive material comprises one or more of platinum, rhodium, iridium, ruthenium, titanium, tantalum, and tungsten.

7. The construction of claim 1 wherein the second conductive material comprises one or more of rhodium oxide, ruthenium oxide, iridium oxide, titanium nitride, titanium boronitride, tantalum nitride, tantalum boronitride, titanium aluminum nitride, and tungsten nitride.

8. The construction of claim 1 wherein the insulative material is selected from the group consisting of silicon nitride, silicon oxynitride, silicon carbide, silicon dioxide, and mixtures thereof.

9. The construction of claim 1 wherein the conductive node comprises conductively-doped silicon.

10. The construction of claim 1 further comprising a third conductive material within the second container opening.

11. The construction of claim 1 further comprising a dielectric material within the second container opening.

12. The construction of claim 1 wherein the first conductive material comprises one or more of rhodium, iridium, ruthenium and tantalum.

13. The construction of claim 1 wherein the second conductive material comprises one or more of rhodium oxide, ruthenium oxide, iridium oxide, titanium boronitride, tantalum nitride, and tantalum boronitride.

14. A capacitor construction, comprising:
   a semiconductor substrate;
   a conductive node supported by the semiconductor substrate;
   a first conductive material over the conductive node, the first conductive material comprising a lower portion with vertically-extending grains and an upper portion with horizontally-extending grains, the lower portion is oriented substantially at 90° relative to the upper portion;
   a dielectric material over the upper portion of the first conductive material; the dielectric material being separated from the lower portion of the first conductive material by the upper portion of the first conductive material; and
   a second conductive material over the dielectric material; the second conductive material being capacitively separated from the first conductive material by the dielectric material.

15. The construction of claim 14 wherein the first conductive material comprises one or more of platinum, rhodium, iridium, ruthenium, titanium, tantalum, and tungsten.

16. The construction of claim 14 wherein the first conductive material comprises one or more of rhodium oxide, ruthenium oxide, iridium oxide, titanium nitride, titanium boronitride, tantalum nitride, tantalum boronitride, titanium aluminum nitride, and tungsten nitride.

17. The construction of claim 14 wherein the second conductive material comprises one or more of platinum, rhodium, iridium, ruthenium, titanium, tantalum, and tungsten.

18. The construction of claim 14 wherein the second conductive material comprises one or more of rhodium oxide, ruthenium oxide, iridium oxide, titanium nitride, titanium boronitride, tantalum nitride, tantalum boronitride, titanium aluminum nitride, and tungsten nitride.

19. The construction of claim 14 wherein the dielectric material is selected from the group consisting of aluminum oxide, tantalum oxide, BST, PZT, PLZT, and mixtures thereof.

20. The construction of claim 14 wherein the semiconductor substrate comprises an upper surface, and wherein the vertically-extending grains of the lower portion extend substantially perpendicularly to the upper surface of the semiconductor substrate.

21. The construction of claim 14 wherein an entirety of the dielectric material comprises a layer extending substantially horizontally over the semiconductor substrate.

* * * * *

UNITED STATES PATENT AND TRADEMARK OFFICE
CERTIFICATE OF CORRECTION

PATENT NO. : 7,078,757 B2  Page 1 of 1
APPLICATION NO. : 10/917705
DATED : July 18, 2006
INVENTOR(S) : Basceri et al.

It is certified that error appears in the above-identified patent and that said Letters Patent is hereby corrected as shown below:

Col. 1, line 10, delete "is a" after "is a".

Col. 3, line 31, insert --of-- after "to that".

Col. 3, line 37, delete "of." After "to that" and insert --of--.

Col. 6, line 33, delete "form" after "above" and insert --for--.

Signed and Sealed this

First Day of May, 2007

JON W. DUDAS
*Director of the United States Patent and Trademark Office*